(12) United States Patent
Lin et al.

(10) Patent No.: US 7,728,580 B2
(45) Date of Patent: Jun. 1, 2010

(54) CONNECTING DEVICE FOR ELECTRONIC TESTING SYSTEM

(75) Inventors: Po-Yu Lin, Taipei Hsien (TW);
Chao-Chien Lee, Taipei Hsien (TW);
Ping-Yuan Lin, Taipei Hsien (TW)

(73) Assignee: Hon Hai Precision Industry Co., Ltd.,
Tu-Cheng, Taipei Hsien (TW)

( * ) Notice: Subject to any disclaimer, the term of this patent is extended or adjusted under 35 U.S.C. 154(b) by 18 days.

(21) Appl. No.: 12/189,129

(22) Filed: Aug. 8, 2008

(65) Prior Publication Data
US 2009/0278558 A1 Nov. 12, 2009

(30) Foreign Application Priority Data
May 7, 2008 (CN) .................. 2008 1 0301462

(51) Int. Cl.
*G01R 31/02* (2006.01)
(52) U.S. Cl. .................... 324/158.1; 439/310
(58) Field of Classification Search ............... None
See application file for complete search history.

(56) References Cited

U.S. PATENT DOCUMENTS

| 4,746,857 | A | * | 5/1988 | Sakai et al. | 324/765 |
| 5,467,023 | A | * | 11/1995 | Takeyama | 324/754 |
| 6,648,662 | B2 | * | 11/2003 | Shinzou et al. | 439/310 |
| 6,731,118 | B2 | * | 5/2004 | Nishino et al. | 324/538 |

* cited by examiner

*Primary Examiner*—Minh N Tang
(74) *Attorney, Agent, or Firm*—Frank R. Niranjan

(57) ABSTRACT

A connecting device for an electronic testing system of an electronic device includes a base, a sliding track, a holder, a plurality of connectors, and a driver. The sliding track is positioned on the base. The holder is slidably fixed to the sliding track. The plurality of connectors are fixed in the holder and the electronic device is connected to the electronic testing system. The driver is located on the base and moves the holder along the sliding track, connecting or disconnecting the plurality of connectors to the connection port of the electronic device.

14 Claims, 3 Drawing Sheets

CONNECTING DEVICE FOR ELECTRONIC TESTING SYSTEM

BACKGROUND

1. Technical Field

The present invention relates to electronic testing systems and, particularly, to a connecting device for an electronic testing system providing connection and disconnection to an electronic device.

2. Description of the Related Art

Generally, leaving the factory, electronic devices undergo various tests to ensure standards of quality have been met. These tests are typically carried out manually. For example, the electronic devices may be manually connected to testing machines and disconnected after the completion of testing. The manual requirement of such testing procedures is time-consuming and inefficient.

Therefore, what is desired is a connecting device for an electronic testing system that can overcome the described limitations.

SUMMARY

In accordance with an embodiment, a connecting device for an electronic testing system is disclosed. The connecting device for an electronic testing system includes a base, a sliding track, a holder, a plurality of connectors, and a driver. The sliding track is positioned on the base. The holder is slidably fixed to the sliding track. The plurality of connectors are fixed in the holder and electrically connected to the electronic testing system (not shown). The driver is located on the base and configured for moving the holder along the sliding track, thereby connecting or disconnecting the plurality of connectors to the connection port of the electronic device (not shown).

Other advantages and novel features will be drawn from the following detailed description of at least one embodiment, when considered in conjunction with the attached drawings.

BRIEF DESCRIPTION OF THE DRAWINGS

Many aspects of the present connecting device for an electronic testing system can be better understood with reference to the attached drawings. The components in the drawings are not necessarily drawn to scale, the emphasis instead being placed upon clearly illustrating the principles of the present connecting device for an electronic testing system. Moreover, in the drawings, like reference numerals designate corresponding parts throughout the several views.

DETAILED DESCRIPTION OF THE EMBODIMENTS

Embodiments of the present connecting device for an electronic testing system will be now described in detail with reference to the drawings. The connecting device for an electronic testing system electrically connects and disconnects an electronic device to the electronic system to perform a variety of tests. In the described embodiments, the electronic device can be, but is not limited to, a mobile phone, a personal digital assistant, or any other electronic device having a connection port.

Figure 1:
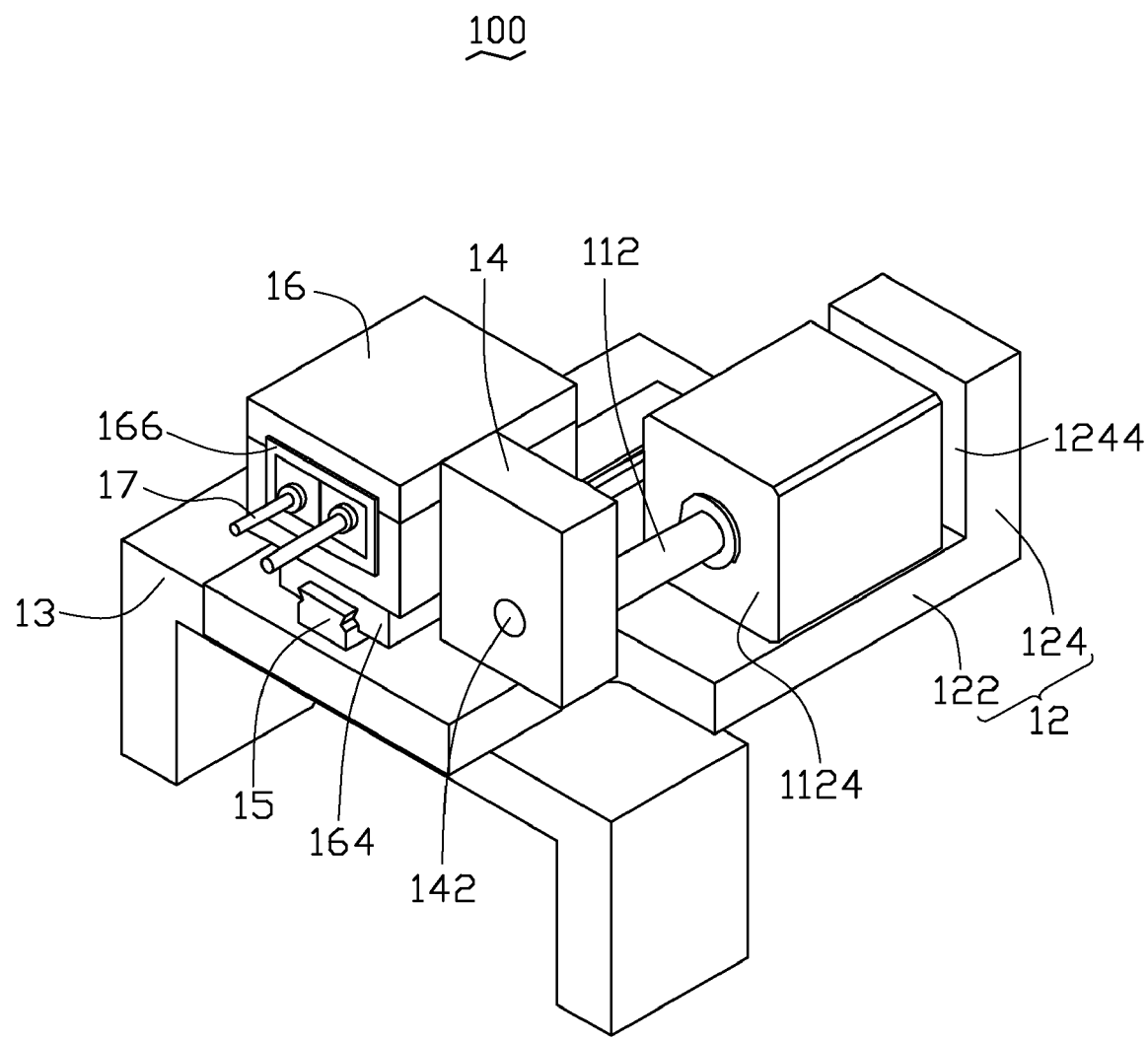
FIG. 1 is an assembled, isometric view of the connecting device for an electronic testing system according to an embodiment of the present invention.
Figure 2:
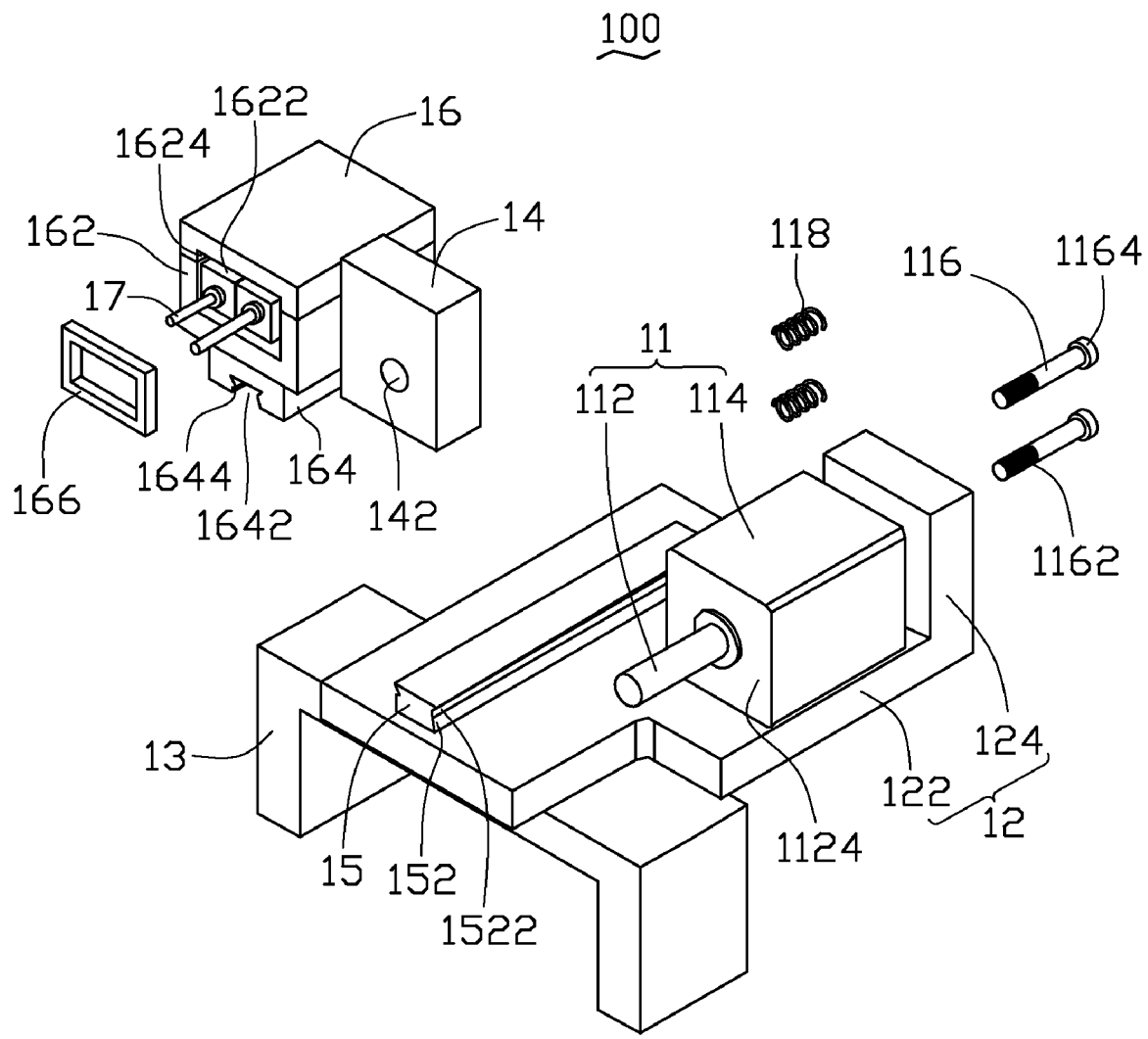
FIG. 2 is an exploded, isometric view of the connecting device of the electronic testing system of FIG. 1.
Figure 3:
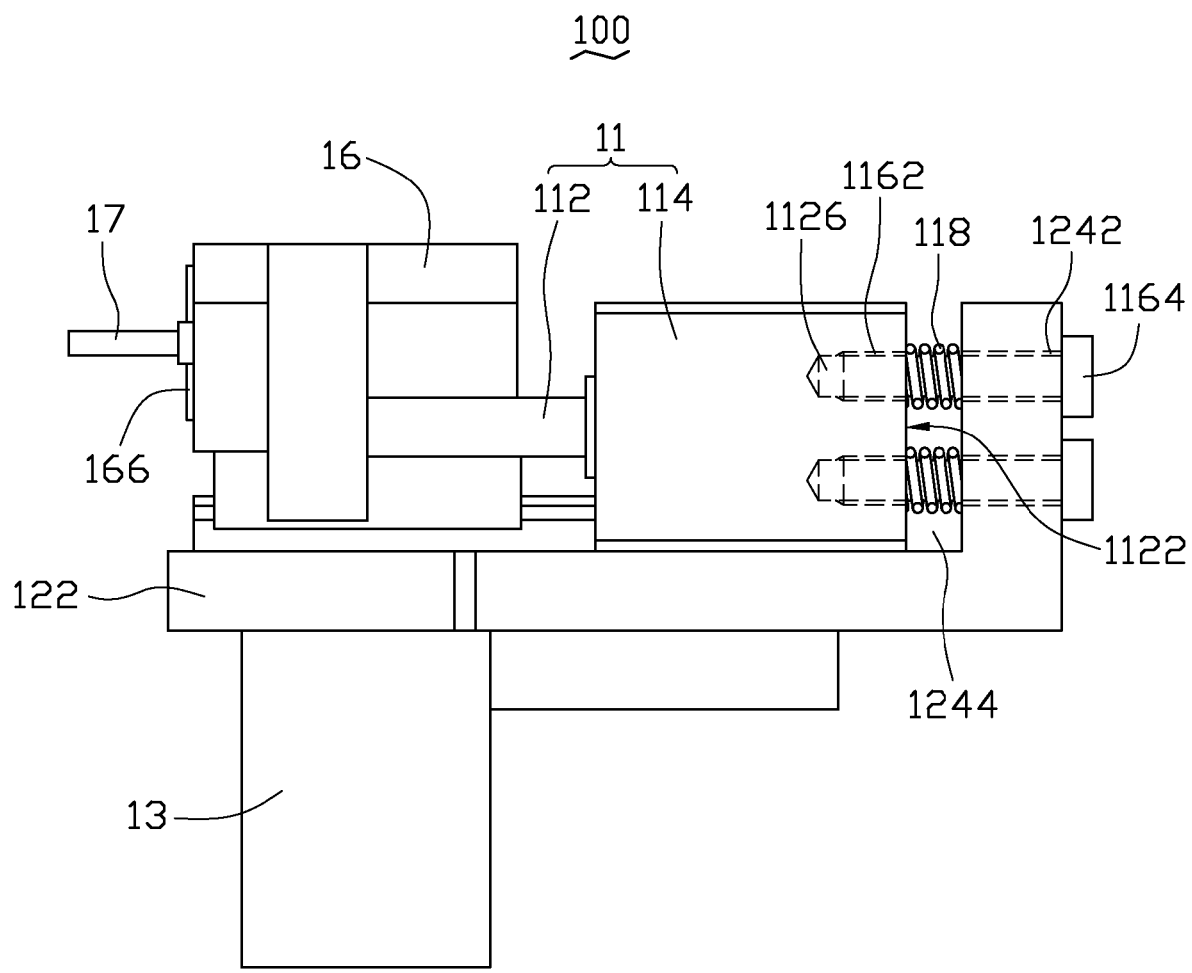
FIG. 3 is a planar, schematic view of the connecting device of the electronic testing system shown in FIG. 2.

Referring to FIG. 1 to FIG. 3, a connecting device for an electronic testing system 100 according to an exemplary embodiment includes a base 12, a sliding track 15, a holder 16, a plurality of connectors 17, and a driver 11. The sliding track 15 is positioned on the base 12. The holder 16 is slidably fixed to the sliding track 15. The plurality of connectors 17 are fixed in the holder 16 and the electronic device is connected to the electronic testing system (not shown). The driver 11 is located on the base 12 and drives the holder 16 along the sliding track 15, thereby connecting and disconnecting the connector 17 to the connection port of the electronic device (not shown).

The base 12 includes a supporting substrate 122 and a standing plate 124. The standing plate 124 protrudes upright from an edge of the supporting substrate 122. This standing plate 124 is configured for locating the driver 11 on the supporting plate 122.

In this embodiment, the sliding track 15 is a longitudinal block comprising two opposite sidewalls 152, substantially perpendicular to the supporting substrate 122. Each sidewall 152 defines a guiding slot 1522 along the longitudinal axis thereof.

The holder 16 includes a holding portion 162 and sliding portion 164. The holding portion 162 defines a holding space 1624 receiving the plurality of connectors 17. The plurality of connectors 17 is loosely fixed in the holder 16, and can thus be finely adjusted to eliminate mechanical complication with the connection port of the electronic device. The holding space 1624 defines a bay 1622 larger than the total size of the plurality of connectors 17. The connecting device for an electronic testing system 100 further includes a flexible buffer 166. The buffer 166 is wrapped around and protrudes out of the bay 1622. The buffer 166 can be rubber, silica gel, or alloys thereof.

The sliding portion 164 defines a track-receiving space 1642 that comprises two opposite sidewalls. Two projectors 1644 respectively protrude from the center of the sidewalls. The projectors 1644 are slidably seated in the guiding slots 1522 of the slide track 15 to axially move the holder 16 on the slide track 15, impelled by the driver 11, and as a result, the sliding portion 164 is slidably and fittingly received in the sliding track 15.

In the illustrated embodiment, the driver 11 is a cylinder including a body 114 and a plunger 112. The body 114 includes a first surface 1122 facing the standing plate 124 of the base 12 and a second surface 1124 facing away from the first surface 1122. The plunger 112 protrudes uprightly from the second surface 1124. The first surface 1122 defines two threaded holes 1126. The standing plate 124 defines two through holes 1242 corresponding to the threaded holes 1126. A space 1244 is defined between the driver 11 and the standing plate 124.

The connecting device for an electronic testing system 100 further includes two elastic elements 118 and two bolts 116. In the illustrated embodiment, the elastic elements 118 are coil springs. Each bolt 116 has a threaded section 1162 defined at one of its distal ends and a cap 1164 at the other. Each bolt 116 passes through a corresponding through hole 1242 and a corresponding coil spring, with its threaded section 1162 engaging the corresponding threaded hole 1126 and its cap 1164 abutting the standing plate 124. Elastic member 118 can thus buffer the plurality of connectors 17 when compressed. In other embodiments, the driver 11 can be a motor, while the elastic elements 118 can be rubber, silica gel, or alloys thereof.

The movable member 14 is fixed in the holder 16. In alternative embodiments, the movable member 14 can be formed with the holder 16. The movable member 14 defines a through hole 142 corresponding to the plunger 112 of the driver 11. The plunger 112 is inserted through the through hole 142, such that movable member 14 moves alternately through movements from the plunger 112. At the same time, movement from the movable member 14 slides the holder 16 back and forth alternately on the sliding track 15. In other embodiments, the movable member 14 can be omitted. The holder 16 is directly fixed to the plunger 112 and, thus, can be forced to slide on the sliding track 15.

The connecting device for an electronic testing system 100 further includes support shelves 13 supporting the base 12.

Upon detection of its presence, an electronic device is fixed facing the connector. The driver 11 slides the holder 16 towards the electronic device to automatically connect the plurality of connectors 17 to the connection ports of the electronic device. Upon completion of the test, the driver 11 slides the holder 16 away from the electronic device to automatically disconnect the plurality of connectors 17 from the connection port of the electronic device.

It will be understood that the above particular embodiments and methods are shown and described by way of illustration only. The principles and the features of the present invention may be employed in various and numerous embodiments thereof without departing from the scope of the invention as claimed. The above-described embodiments illustrate the scope of the invention but do not restrict the scope of the invention.

What is claimed is:

1. A connecting device for an electronic testing system for an electronic device, the connecting device including:
   a plurality of connectors;
   a slip track;
   a holder slidably fixed to the slip track;
   a driver moving the holder along the slip track, the driver comprises a first surface and a second surface facing away the first surface, the first surface defining two threaded holes, the standing plate defining two through holes corresponding to the threaded holes, and a space defined between the driver and the standing plate;
   a base comprising a supporting substrate on which the plurality of connectors, the holder, the slip track and the driver being supported, the base further comprising a standing plate facing the first surface of the driver and protruding upright from an edge of the supporting substrate; and
   two bolts and two elastic elements, each bolt respectively defining threading at one of its distal ends and a cap at the other, inserted through a corresponding through hole and a corresponding elastic element with the threading engaging the corresponding threaded hole and cap abutting the standing plate.

2. The connecting device for an electronic testing system as claimed in claim 1, wherein the two elastic elements are coil springs.

3. The connecting device for an electronic testing system as claimed in claim 1, wherein the two elastic elements are rubber, silica gel, or alloys thereof.

4. The connecting device for an electronic testing system as claimed in claim 1, wherein the holder comprises a sliding portion and holding portion receiving the plurality of connectors, the holding portion defines a holding space receiving the plurality of connectors, the holding space defines an bay, the size of bay exceeding the total size of the plurality of connectors, and wherein the connecting device for an electronic testing system further comprises a flexible buffer surrounding the plurality of connectors, coiled around the bay and protruding therefrom.

5. The connecting device for an electronic testing system as claimed in claim 4, wherein the flexile buffer is rubber, silica gel, or alloys thereof.

6. The connecting device for an electronic testing system as claimed in claim 1, wherein the connecting device for an electronic testing system further includes support shelves supporting the base.

7. A connecting device for an electronic testing system for an electronic device, the connecting device including:
   a plurality of connectors;
   a slip track;
   a holder slidably fixed to the slip track;
   a movable member positioned on a sidewall of the holder;
   a driver moving the holder along the slip track, the driver being a cylinder comprising a body, a plunger, and a first surface and a second surface facing away the first surface, the plunger protrudes out of the second surface along direction axis substantially perpendicular thereto, the movable member defining a through hole corresponding to the location of the plunger of the driver and through which the plunger being inserted;
   a base comprising a supporting substrate on which the plurality of connectors, the holder, the slip track and the driver are supported, the base further comprising a standing plate protruding upright from an edge of the supporting substrate and facing first surface of the driver.

8. The connecting device for an electronic testing system as claimed in claim 7, wherein the movable member is integrally formed with and extends upward from a sidewall of the holder.

9. The connecting device for an electronic testing system as claimed in claim 7, wherein the first surface defines two threaded holes, the standing plate defines two through holes corresponding thereto, and a space is defined between the driver and the standing plate, wherein the connecting device for an electronic testing system further comprises two bolts and two elastic elements, each bolt respectively defines screw threading at one distal end and a cap at the other, and wherein each bolt is inserted through a corresponding through hole and a corresponding elastic element with its threading engaging a corresponding threaded hole and its cap abutting the standing plate.

10. The connecting device for an electronic testing system as claimed in claim 9, wherein the two elastic elements are coil springs.

11. The connecting device for an electronic testing system as claimed in claim 9, wherein the two elastic elements are rubber, silica gel, or alloys thereof.

12. The connecting device for an electronic testing system as claimed in claim 7, wherein the holder comprises a sliding portion and a holding portion receiving the plurality of connectors, the holding portion defining a holding space receiving the plurality of connectors, the holding space defining an bay, the size of bay which exceeds the total size of the plurality of connectors, and wherein the connecting device for an electronic testing system further includes a flexible buffer surrounding the plurality of connectors, coiled around the bay and protruding therefrom.

13. The connecting device for an electronic testing system as claimed in claim 12, wherein the flexible buffer is rubber, silica gel, or alloys thereof.

14. The connecting device for an electronic testing system as claimed in claim 7, wherein the connecting device for an electronic testing system further includes support shelves supporting the base.

* * * * *